United States Patent [19]

Kyles et al.

[11] 4,341,950

[45] Jul. 27, 1982

[54] METHOD AND CIRCUITRY FOR SYNCHRONIZING THE READ AND UPDATE FUNCTIONS OF A TIMER/COUNTER CIRCUIT

[75] Inventors: Ronald H. Kyles, Colorado Springs; Richard B. Woodard, Elbert, both of Colo.

[73] Assignee: NCR Corporation, Dayton, Ohio

[21] Appl. No.: 114,925

[22] Filed: Jan. 24, 1980

[51] Int. Cl.³ ............................................. H03K 21/30
[52] U.S. Cl. .............................. 235/92 EA; 235/92 T
[58] Field of Search ............ 235/92 T, 92 PB, 92 FP, 235/92 EA, 92 DP, 92 EC

[56] References Cited

U.S. PATENT DOCUMENTS

| | | | |
|---|---|---|---|
| 3,063,631 | 11/1962 | Ray | 235/92 EA |
| 3,602,699 | 8/1971 | Kamachi | 235/92 EA |
| 3,716,703 | 2/1973 | Gordon | 235/92 EC |
| 3,789,195 | 1/1974 | Meier et al. | 235/92 T |
| 3,806,709 | 4/1974 | Fitch et al. | 235/92 EA |

OTHER PUBLICATIONS

"8253/8253-5 , Programmable Interval Timer", Nitel Corp., 1978, specification sheets 1-40 thru 1-50.

*Primary Examiner*—Joseph M. Thesz
*Attorney, Agent, or Firm*—J. T. Cavender; Philip A. Dalton

[57] ABSTRACT

The present invention pertains to a method and synchronizer circuit for controlling the counting operation of a timer/counter circuit to synchronize the read and update functions of this circuit. The synchronizer circuit is capable of establishing a search period prior to the occurrence of each update function. During each such search period, the synchronizer circuit searches for a read command. If a read command is not received by the synchronizer circuit within the search period preceding the occurrence of an update function, the synchronizer circuit allows the update function to occur without delay. If a read command is received by the synchronizer circuit within the search period preceding the occurrence of an update function, the synchronizer circuit delays the start of the update function until after termination of the read command that was received within the search period.

8 Claims, 9 Drawing Figures

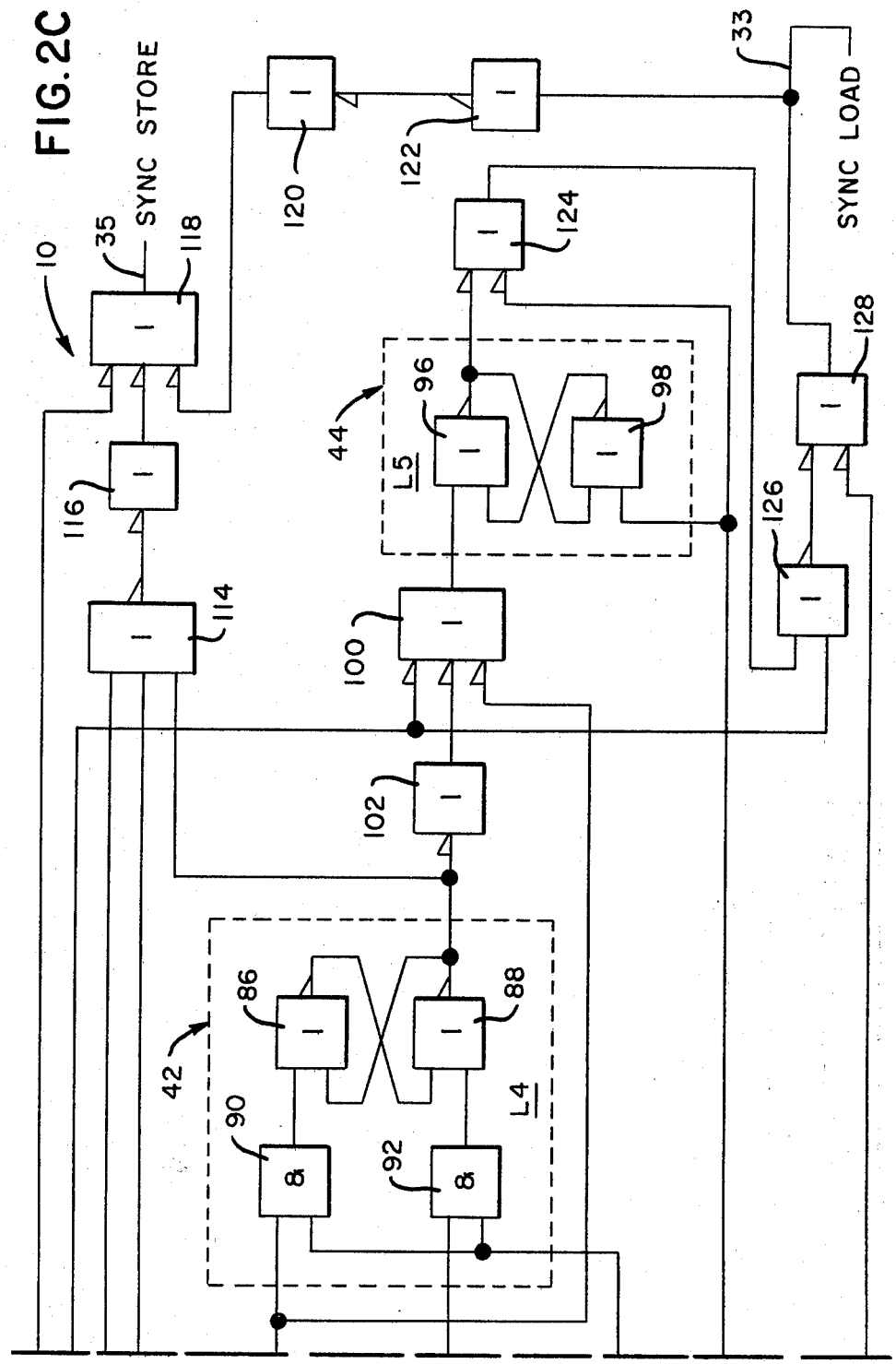

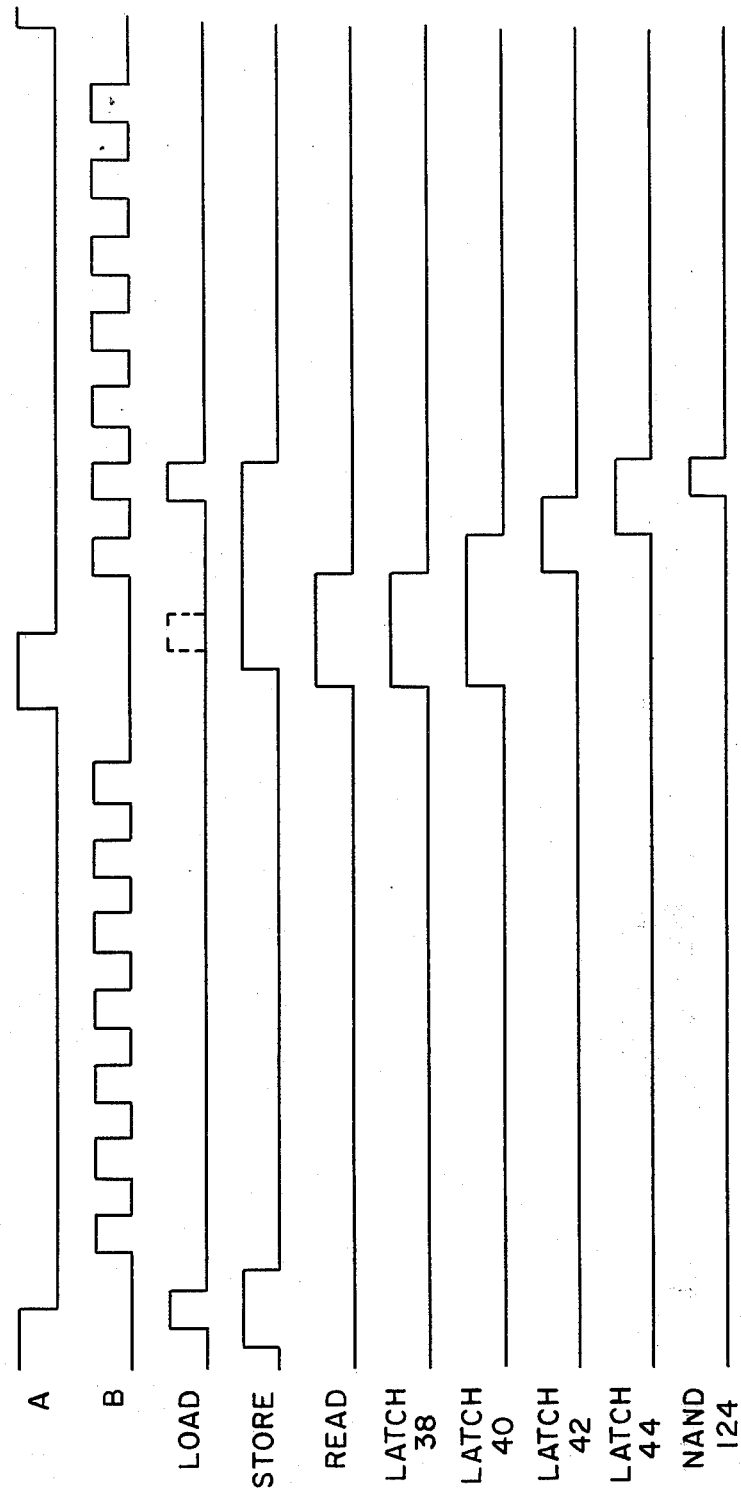

METHOD AND CIRCUITRY FOR SYNCHRONIZING THE READ AND UPDATE FUNCTIONS OF A TIMER/COUNTER CIRCUIT

BACKGROUND OF THE INVENTION

This invention relates in general to a synchronizer circuit for controlling the counting operation of an associated timer/counter circuit which is well suited for use in a microcomputer system as an interval timer or event counter. In particular, the synchronizer circuit of the present invention is operable to resolve any conflicts that may result from the simultaneous occurrence of a load pulse that is attempting to update the count value stored within the timer/counter circuit and a read command that is attempting to obtain the count value stored within the timer/counter circuit. By resolving such conflicts, the synchronizer circuit is operable to synchronize the timer/counter circuit's update and read functions such that the timer/counter circuit may be randomly interrogated during its counting operation without adversely affecting or disturbing the count in progress.

In order to minimize overhead in a software routine, many of the timing and counting functions that are essential to the proper operation of today's more sophisticated microcomputer systems are performed by peripheral components such as interval timers and event counters. An interval timer is typically comprised of a counting circuit that is arranged to generate an accurate time period under software control. The interval timer is constructed to have a preselected maximum count state that corresponds to the desired time interval. Upon command, a clock signal is provided to the interval timer causing it to begin counting to its maximum count state. Once this count state is reached, the interval timer generates a logic signal that indicates that the preselected time period has ended. An event counter operates in basically the same manner as an interval timer with the exception that the timer/counter circuit is not clocked by a periodic clock signal but rather by a logic signal that is generated in response to the occurrence of a particular event.

When using interval timers and event counters, it is often necessary to obtain the contents of the timer/counter circuit while the circuit's counting operation is still in progress. If the timer/counter circuit and its associated microcomputer are operating at two different frequencies, it is possible for the timer/counter circuit to be updating its count state at the same time as it is being interrogated by the microcomputer. This condition can produce instabilities that may have an adverse effect upon the outputted data.

A presently known synchronization technique for overcoming the above-mentioned problem involves a two-step procedure. In the first step of this technique the microcomputer sets an anticipation flag within the timer/counter circuit a preselected period of time before the timer/counter circuit is to be interrogated by the microcomputer. The timer/counter circuit responds to this flag by causing its count state to be latched into an associated holding register. This latching function is performed by the timer/counter circuit within the next time slot during which the count state of the timer/counter circuit is not being updated. Since the count state of the timer/counter circuit must be stored within the holding register prior to interrogation of this circuit by the microcomputer, it is imperative that the timer/counter circuit be operating at a frequency that is equal to or less than the operating frequency of the microcomputer. The second step of the technique involves the issuance of a normal read command by the microcomputer. The timer/counter circuit responds to this read command by providing to the microcomputer the count value stored within the holding register.

The above-described synchronization technique, however, is unsatisfactory in several respects. In particular, this technique is fairly complicated to implement, and as a result, adds considerable overhead to software routines that utilize the services of an interval timer or event counter. A further problem associated with the above-mentioned technique is that the timer/counter circuit must be operated at a frequency that is equal to or less than the operating frequency of the microcomputer. This requirement limits the flexibility of the microcomputer system. Accordingly, the above-described synchronization technique has a number of inherent disadvantages that make it undesirable for use in today's more sophisticated microcomputer systems.

SUMMARY OF THE INVENTION

The synchronizer circuit described herein overcomes the disadvantages associated with the above-described synchronization technique. In particular, the synchronizer circuit of the present invention controls the counting operation of its associated timer/counter circuit to thereby synchronize the read and update functions of this circuit.

The synchronizer circuit accomplishes synchronization of the read and update functions of its associated timer/counter circuit by controlling the application of load pulses to its associated timer/counter circuit. These load pulses are periodically generated by an external timing circuit and are provided to the timer/counter circuit through the synchronizer circuit to initiate the update function of the timer/counter circuit. The external timing circuit also generates various additional timing signals which drive and control the operation of the synchronizer circuit.

The synchronizer circuit responds to the timing signals produced by the external timing circuit by establishing a search period prior to receipt of a load pulse. During the search period preceding a load pulse, the synchronizer circuit searches for a read command. If a read command is not received by the synchronizer circuit within the search period preceding a load pulse, the next load pulse is passed to the timer/counter circuit unimpeded. Upon receipt of this load pulse, the timer/counter circuit causes its present count state to be updated. If a read command is received by the synchronizer circuit, passage of the received load pulse to the timer/counter circuit is inhibited by the synchronizer circuit. Thereafter, the synchronizer circuit generates a delayed load pulse following termination of the read command that was received within the preceding search period. The delayed load pulse is then provided to the timer/counter circuit where it causes the counting operation of this circuit to be updated. In this way, the synchronizer circuit of the present invention controls the application of a load pulse to its associated timer/counter circuit in response to the absence or presence of a read command during the search period preceding the load pulse.

It is therefore an object of the present invention to provide an improved technique and circuit for effectively synchronizing in a simple and reliable manner the update and read functions of an associated timer/counter circuit that is suitable for use in a microcomputer system as an event counter or interval timer, even if the timer/counter circuit is operating at a frequency that is greater than the operating frequency of the system's microcomputer.

A further object of the present invention is to provide a synchronizer circuit for controlling the counting operation of an associated timer/counter circuit so as to resolve any conflicts that may result from the simultaneous occurrence of a read command that is attempting to obtain the count value stored within the synchronizer circuit's associated timer/counter circuit and a load pulse that is attempting to update the count value stored within the synchronizer circuit's associated timer/counter circuit.

Another object of the present invention is to provide a synchronizer circuit for controlling the counting operation of an associated timer/counter circuit so as to allow the timer/counter circuit to be randomly interrogated by a microcomputer without adversely affecting the count in progress.

A further object of the present invention is to provide a synchronizer circuit for controlling the counting operation of a timer/counter circuit that is suitable for use in a microcomputer system as an interval timer or an event counter such that the timer/counter circuit may be operated at a frequency that is greater than the operating frequency of the system's microcomputer.

An additional object of the present invention is to provide a synchronizer circuit for controlling the application of load pulses to an associated timer/counter circuit to thereby synchronize the update and read functions performed by the timer/counter circuit.

Another object of the present invention is to provide a synchronizer circuit of the character described that is capable of being quickly and easily implemented using conventional large scale integration techniques.

Still another object of the present invention is to provide a synchronizer circuit of the character described that is capable of being quickly and easily implemented at a minimal cost.

It is an additional object of the present invention to provide a method for controlling the counting operation of a timer/counter circuit so as to resolve any conflicts that may result from the simultaneous occurrence of a read command that is attempting to obtain the count value stored within the synchronizer circuit's associated timer/counter circuit and a load pulse that is attempting to update the value stored within the synchronizer circuit's associated timer/counter circuit.

It is yet another object of the present invention to provide a method of the character described that is capable of greatly reducing the amount of software needed to read the contents of a timer/counter circuit that is being used as an interval timer or event counter.

It is a further object of the present invention to provide a method for controlling the counting operation of a timer/counter circuit that is suitable for use in a microcomputer system such that the timer/counter circuit can be operated at a frequency that is greater than the operating frequency of the system's microcomputer.

BRIEF DESCRIPTION OF THE DRAWING

FIG. 6 is a waveform diagram showing the operation of the synchronizer circuit of the present invention.

DETAILED DESCRIPTION OF THE INVENTION

Figure 1:
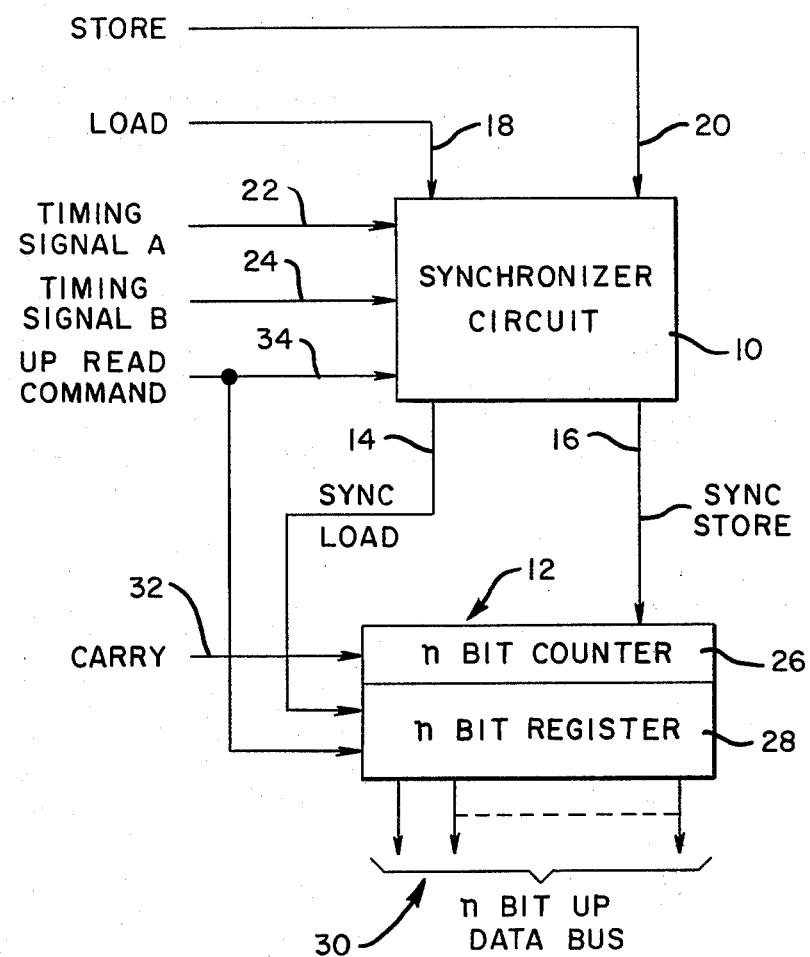
FIG. 1 is a schematic block diagram showing the operable relationship between the synchronizer circuit of the present invention and its associated timer/counter circuit.
Figure 7:
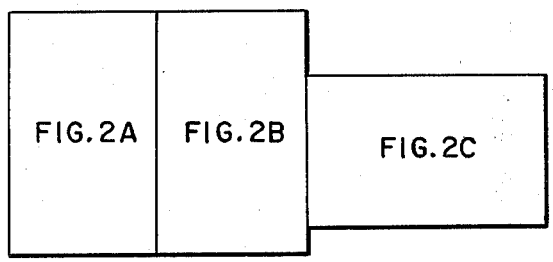
FIG. 7 is a plot showing how FIGS. 2A, B and C are to be arranged for proper viewing.

Reference is now made to FIG. 1 for a brief description of the operation of the synchronizer circuit of the present invention. As shown in FIG. 1, the synchronizer circuit is identified by the numeral 10 and is used in combination with an N bit timer/counter circuit 12. The synchronizer circuit 10 is operably coupled with the N bit timer/counter circuit 12 by means of a sync load line 14 and a sync store line 16. Synchronizer circuit 10 is also arranged to receive a plurality of control signals from an external source. These signals include a load signal which is applied to the synchronizer circuit 10 via an input 18, a store signal which is applied to the synchronizer circuit via an input 20, a first timing signal (designated timing signal A) which is applied to the synchronizer circuit via an input 22, and a second timing signal (designated timing signal B) which is applied to the synchronizer circuit via input 24.

Figure 4:
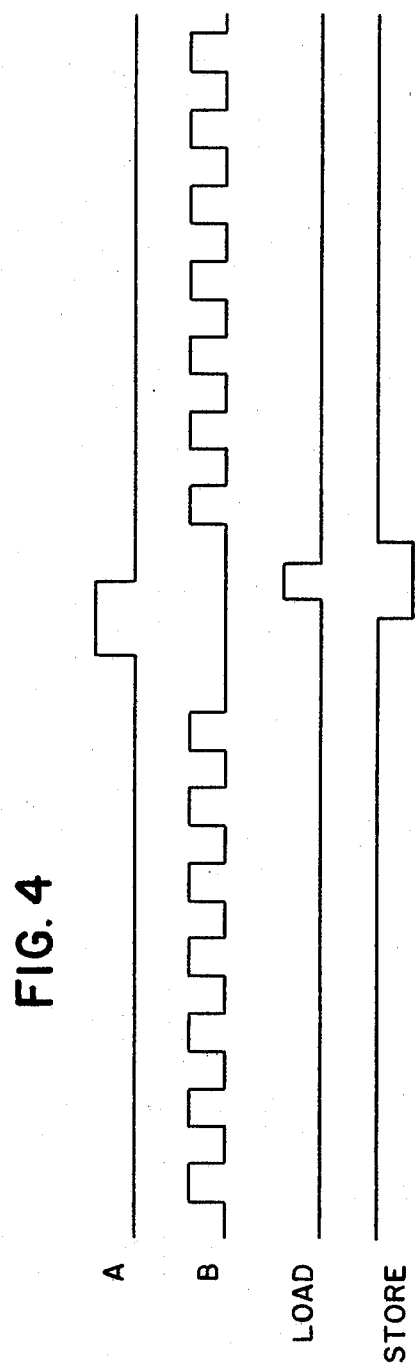
FIG. 4 is a waveform diagram showing a plurality of control signals that are used by the synchronizer circuit of the present invention to control the counting operation of its associated timer/counter circuit.

The timing relationship between these control signals is shown in FIG. 4. The load signal is comprised of a plurality of load pulses which occur periodically. While the frequency of these load pulses is arbitrary, it is desirable to generate the load pulses at a rate that allows several of them to occur between any two read cycles of the microcomputer. The store signal is comprised of a signal having a normally high level logic state. This signal, however, assumes a low level logic state a set period of time prior to the occurrence of a load pulse and remains at a low level logic state until a set period of time after the termination of the load pulse. In this way, the store signal is arranged to frame each load pulse with a low level logic signal. Timing signal A is comprised of a plurality of anticipation pulses which are generated such that the leading edge of an anticipation pulse occurs a set period of time before the leading edge of an associated load pulse. The falling edge of the anticipation pulse, on the other hand, occurs while its associated load pulse is still being generated. In this way, an anticipation pulse is initiated a set period of time before generation of an associated load pulse and is terminated while its associated load pulse is still being generated. Timing signal B is a shift clock signal which is comprised of a set number of timing pulses that periodically occur between load pulses. As shown in FIG. 4, the clock pulses that comprise timing signal B are disabled for a set period of time prior to and following the occurrance of an anticipation pulse of timing signal A.

Figure 5:
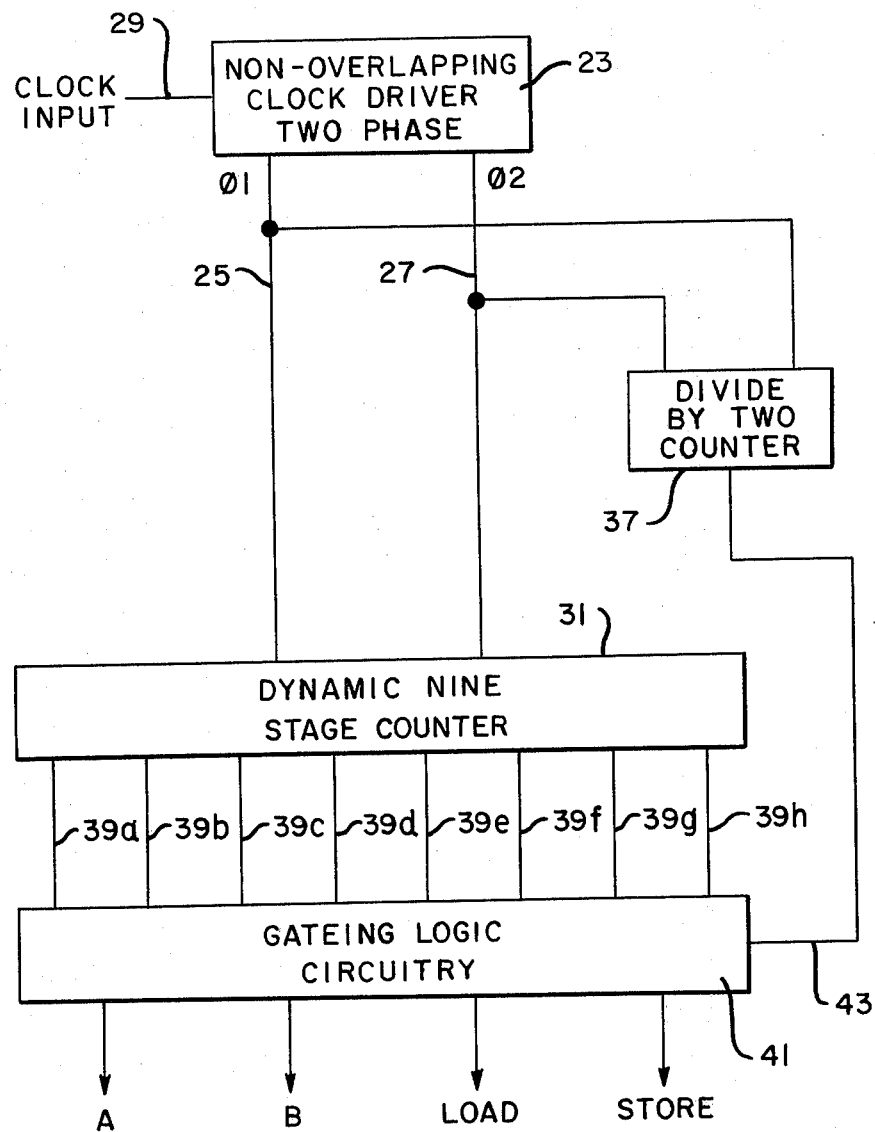
FIG. 5 is a block diagram of a timing circuit which is capable of generating the timing signals shown in FIG. 4.

These control signals are typically generated in an external timing circuit which is of conventional design. A timing circuit capable of generating these control signals is shown in block form in FIG. 5. As shown in FIG. 5, this circuit is comprised of a nonoverlapping clock driver 23 which is capable of producing two-phase clock pulses at outputs 25 and 27 in response to a clock signal provided to clock driver 23 via input 29. Outputs 25 and 27 are in turn electrically coupled with a dynamic nine stage counter 31 and a divide-by-two counter 37. Nine stage counter 31 is equipped with a plurality of outputs 39a–h and is capable of producing on these outputs a logic signal which is representative of the present count state of the counter. Outputs 39a–h of the dynamic nine stage counter 31 are in turn operatively coupled with gating logic circuitry 41 to provide to this circuitry the logic signal representative of the present count state of counter 31. Divide-by-two counter 37 is equipped with a single output 43 which is also coupled with gating logic circuit 41. Gating logic circuit 41 is simply a logic circuit which is capable of generating the desired control signals in response to the logic signals produced on outputs 39a–h of dynamic nine stage counter 31 and output 43 of divide-by-two counter 37. Since the specific design of this timing circuit is not an integral part of the present invention and since the construction of a timing circuit capable of producing the desired control signals is readily apparent to those of ordinary skill in the art, a detailed description of this circuit will not be undertaken herein.

Returning now to FIG. 1, the timer/counter circuit 12 is comprised of an N bit counter 26 and an N bit storage register 28 for holding the current count value of the counter. The timer/counter circuit 12 is also equipped with a plurality of outputs which cooperate to provide a data bus which is generally designated by the numeral 30. A carry input 32 is provided to control the incrementing and decrementing of the timer/counter circuit 12.

The synchronizer circuit 10 and the timer/counter circuit 12 are also capable of receiving read commands from an associated microcomputer (not shown herein) by means of an input 34. The microcomputer generates these read commands randomly in response to the need for data regarding the current count value stored within the timer/counter circuit. The timer/counter circuit responds to the receipt of such a read command by outputting on its output bus 30 a signal that is representative of the count state stored within the circuit's storage register 28.

Since these read signals are randomly generated by the microcomputer, it is possible for a read command to be received by the timer/counter circuit 12 at the same time as the count value of this circuit is being updated. As mentioned above, this condition can produce within the timer/counter circuit 12 instabilies that may adversely affect the outputted data and/or present count state of the circuit. Synchronizer circuit 10, however, is operable to control the counting operation of timer/counter circuit 12 so as to synchronize the update and read functions of this circuit to thereby prevent such instabilities from occurring.

As mentioned above, timing signal B is disabled for a set period of time prior to receipt of a load pulse. During each such period, synchronizer circuit 10 searches for the occurrence of a read command. If a read command is not received by synchronizer circuit 10 in the period preceding a load pulse when timing signal B is disabled, the load pulse is propagated through synchronizer circuit 10 unimpeded and is passed to the timer/counter circuit 12 by means of the sync load line 14 without delay. If, on the other hand, a read command is received by synchronizer circuit 10 within the period preceding a load pulse when timing signal B is disabled, propagation of the load pulse to timer/counter circuit 12 is inhibited by the synchronizer circuit. Thereafter, a delayed load pulse is generated by the synchronizer circuit once the read command which caused the load pulse to be delayed has been terminated. The delayed load pulse is then passed to timer/counter circuit 12 by means of the sync load line 14. In this way, synchronizer circuit 10 is capable of establishing a search period which is initiated upon termination of the last clock pulse of timing signal B preceding a load pulse and is terminated upon receipt of the next load pulse, of searching for the receipt of a read command during such a search period and of either propagating a load pulse to timer/counter circuit 12 unimpeded if a read command was not received by the synchronizer circuit within the search period preceding the load pulse or delaying propagation of a load pulse to the timer/counter circuit if a read command was received by the synchronizer circuit within the search period preceding the load pulse. Accordingly, the synchronizer circuit 10 of the present invention is operable to control the application of a load pulse to its associated timer/counter circuit in response to the presence or absence of a read command during the search period preceding the load pulse.

The synchronizer circuit 10 is also capable of passing to timer/counter circuit 12 by means of the sync store line 16 a logic signal that has a logic state corresponding to the logic state of the store signal received by the synchronizer circuit at input 20. If a read command is received by the synchronizer circuit 10 during the search period preceding a load pulse, then the synchronizer circuit maintains the sync store line at a low level logic state until after the delayed load pulse has been passed to timer/counter circuit 12 by means of the sync load line 16.

Upon receipt of a load pulse, the timer/counter circuit 12 causes its count state to be updated. In particular, the counter portion 26 of timer/counter circuit 12 causes the updated count state to be stored at a temporary location whenever a low level logic signal is applied to the timer/counter circuit 12 by means of the sync store line 16. The value of the updated count state is determined by the logic level of the signal that is applied to the timer/counter circuit 12 by means of the carry input 32. The updated count state is then latched into holding register 28 upon receipt of a load pulse from the synchronizer circuit 10 by means of the sync load line 14. In this way, the load pulse acts as an increment/decrement signal that advances the count state of the timer/counter circuit 12. Since the application of load pulses to the timer/counter circuit 12 is controlled by the synchronizer circuit 10, synchronizer circuit 10 operates to control the counting operation of the timer/counter circuit to thereby synchronize the read and update functions of the timer/counter circuit.

Figure 2A:
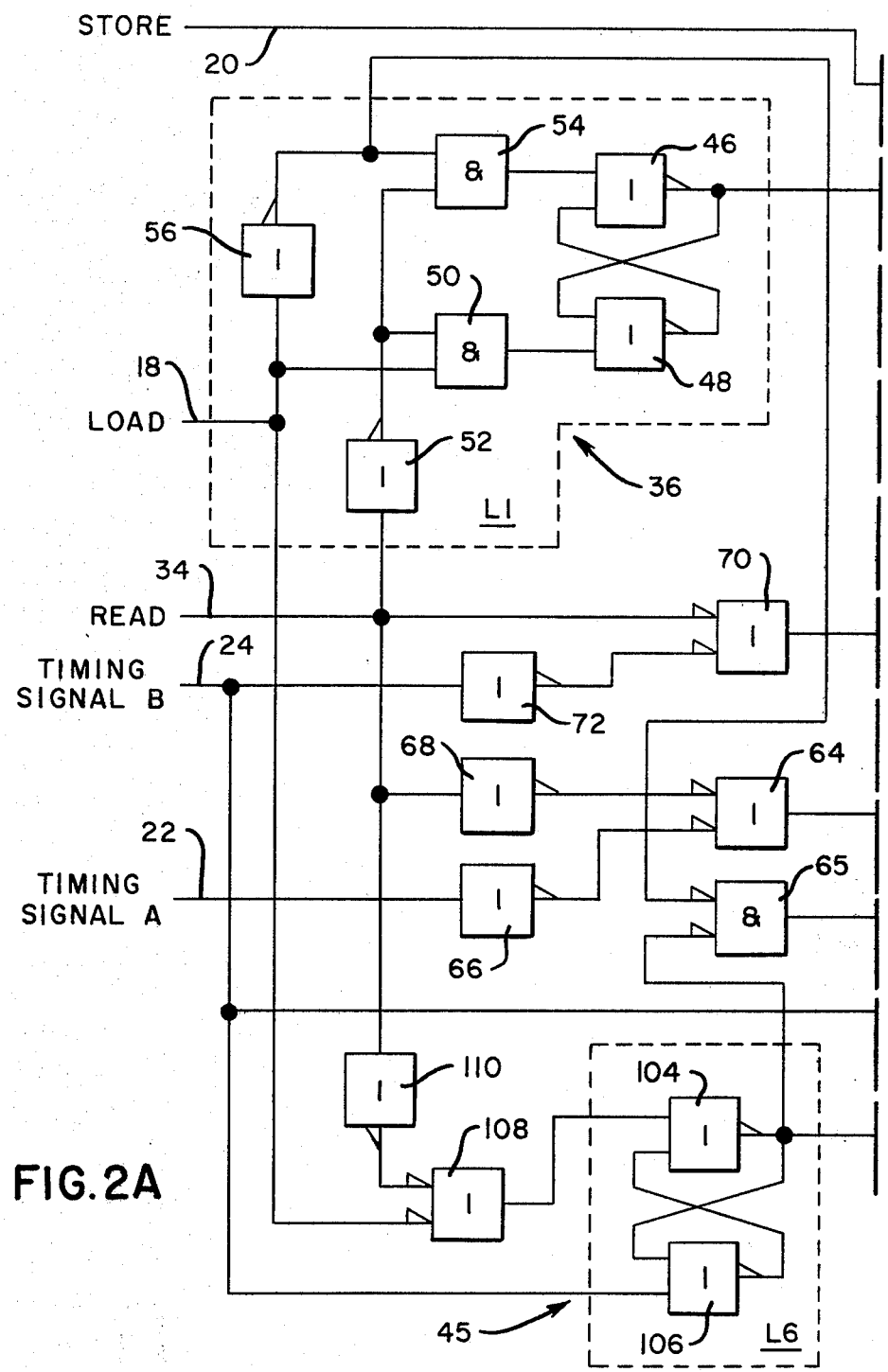
FIGS. 2A, B, and C are to be arranged to provide a detailed schematic diagram of a synchronizer circuit which is constructed in accordance with a preferred embodiment of the present invention.

Reference is now made to FIGS. 2A, B and C wherein the synchronizer circuit 10 is shown in greater detail. As shown in FIGS. 2A, B and C, synchronizer circuit 10 includes a plurality of latches which are generally designated by the numerals 36, 38, 40, 42, 44 and 45. The load, store, timing signal A, timing signal B, and read inputs shown in FIG. 1 are identified in FIG. 2 by the numerals 18, 20, 22, 24 and 34, respectively. The synchronizer circuit 10 is also equipped with a sync load output 33 which is connected with the sync load line 14 (shown in FIG. 1) and a sync store output 35 which is connected with the sync store line 16 (shown in FIG. 1).

Latch 36 is basically comprised of a pair of NOR gates 46 and 48 which are interconnected to form an R-S flip flop. The set input of this flip flop is derived from the output of an AND gate 50. One input of AND gate 50 is in turn coupled with the load input 18, while the other input of this gate is coupled with the read input 34 through an inverter 52. The output of a second AND gate 54 is provided to one input of NOR gate 46 and acts as the reset of the flip flop that is comprised of NOR gates 46 and 48. One input of AND gate 54 is electrically coupled with the read input 34 through inverter 52, while the other input of this gate is electrically coupled with the load input 18 through an inverter 56. The output of NOR gate 46 is in turn electrically coupled with one input of a NOR gate 58 through an inverter 60.

Latch 38 is comprised of a pair of NOR gates 60 and 62 which are interconnected to form an R-S flip flop. The flip-flop that is comprised of NOR gates 60 and 62 is provided with two set inputs which are derived from the outputs of a pair of NOR gates 64 and 65. One input of NOR gate 64 is electrically coupled with timing signal A input 24 through an inverter 66, while the other input of this gate is electrically coupled with read input 34 through an inverter 68. NOR gate 60 is provided with two inputs, both of which act as a reset for the flip flop that is comprised of NOR gates 60 and 62. One input of NOR gate 60 is electrically coupled with the output of NOR gate 58. The other input of NOR gate 60 is electrically coupled with the output of a NOR gate 70. One input of NOR gate 70 is directly connected with read input 34, while the other input of NOR gate 70 is electrically coupled with timing signal B input 22 through an inverter 72.

A pair of NOR gates 74 and 76 and a pair of AND gates 78 and 80 comprise latch 40. NOR gates 74 and 76 are inter-connected to form a R-S flip flop. The output of AND gate 78 is electrically coupled with one input of NOR gate 74, while the output of AND gate 80 is electrically coupled with one input of NOR gate 76. The input of NOR gate 74 to which AND gate 78 is coupled serves as the reset input of the flip flop that is formed by NOR gates 74 and 76. The set input of this flip flop is formed by the input of NOR gate 76 that is electrically coupled with the output of AND gate 80. AND gates 78 and 80 are each equipped with a pair of inputs. One input of AND gate 78 is electrically coupled with timing signal B input 22 through an inverter 82. The other input of this logic gate is coupled with the output of NOR gate 60 through an inverter 84. One of the inputs of AND gate 80 is electrically coupled with timing signal B input 22 through inverter 82, while the other input of this logic gate is connected directly with the output of NOR gate 60.

The latch that is generally designated by the numeral 42 is comprised of a pair of NOR gates 86 and 88 and a pair of AND gates 90 and 92. NOR gates 86 and 88 are interconnected to form an R-S flip flop having a set input that is electrically coupled with the output of AND gate 90 and a reset input that is electrically coupled with the output of AND gate 92. One input of each of these AND gates 90 and 92 is electrically coupled with timing signal B input 22 by means of inverters 82 and 94. The other input of AND gate 90 is in turn directly coupled with the output of NOR gate 74, while the other input of AND gate 92 is connected directly to the output of NOR gate 76.

An R-S flip flop that is comprised of a pair of NOR gates 96 and 98 forms latch 44. The set input of this flip flop is derived from the output of a NOR gate 100. NOR gate 100 is in turn equipped with three separate inputs. The three inputs of this logic gate are in turn coupled with the output of NOR gate 58, with the output of NOR gate 88 through an inverter 102, and with the output of NOR gate 74, respectively. The reset input of the flip flop comprised of NOR gates 96 and 98 is provided at NOR gate 98 and is electrically coupled with the output of inverter 82.

The final latch of the synchronizer circuit 10 is generally designated by the numeral 45 and is comprised of a pair of NOR gates 104 and 106 which are interconnected to form an R-S flip flop. The set input of this flip flop is derived from the output of a NOR gate 108. NOR gate 108 is in turn provided with a pair of inputs. One of these inputs is electrically coupled with the load input 18, while the other input of this logic gate is electrically coupled with read input 34 through an inverter 110. The reset input of this flip flop is comprised of the input of NOR gate 106 that is electrically coupled with timing signal B input 22. The output of NOR gate 104 is in turn applied to one input of AND gate 58 through an inverter 112 and to one input of NOR gate 65. The other input of NOR gate 65 is electrically coupled with load input 18 through inverter 56.

Figure 2B:
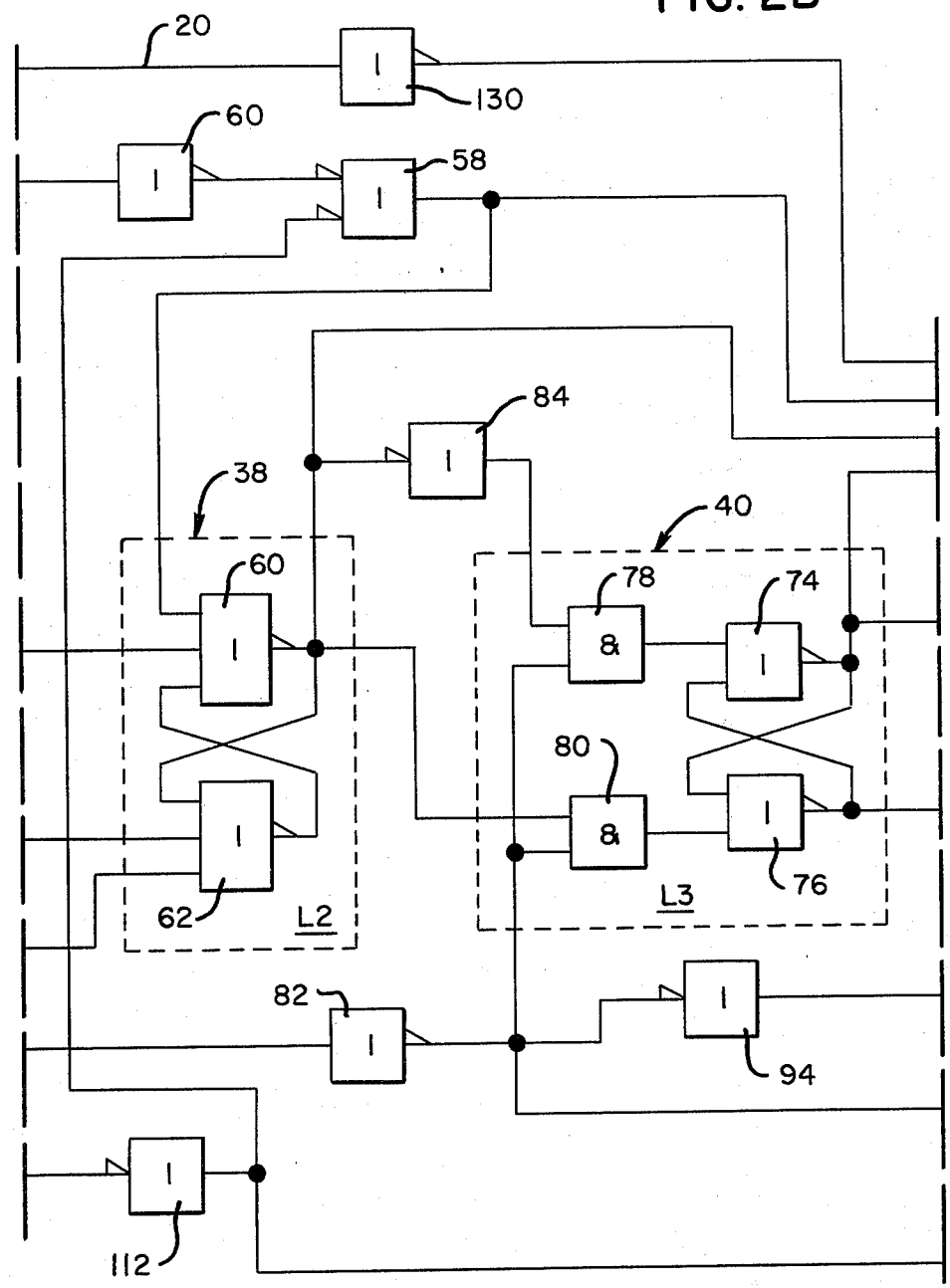

The synchronizer circuit 10 also includes a plurality of logic gates 114, 116, 118, 120, 122, 124, 126 and 128 for coordinating the outputs of the various latches to derive the sync load output 33 and the sync store output 35. As shown in FIG. 2, the sync load output 33 is electrically coupled with the output of NOR gate 128. This logic gate is in turn provided with a pair of inputs which are respectively coupled with the output of inverter 112 and with the output of NOR gate 126. One input of NOR gate 126 is electrically coupled with the output of NOR gate 58, while the other input of NOR gate 126 is coupled with the output of NOR gate 124. The two inputs of NOR gate 124 are in turn derived from the output of NOR gate 96 and from the output of inverter 82.

The sync store output 35, on the other hand, is electrically coupled with the output of NOR gate 118. NOR gate 118 has three inputs which are respectively coupled with the output of logic gate 128 through inverters 120 and 122, with the output of NOR gate 114 through inverter 116, and with the store input 20 through an inverter 130. NOR gate 114 is provided with three separate inputs. These three inputs are in turn respectively coupled with the outputs of NOR gates 60, 74 and 88.

Figure 3:
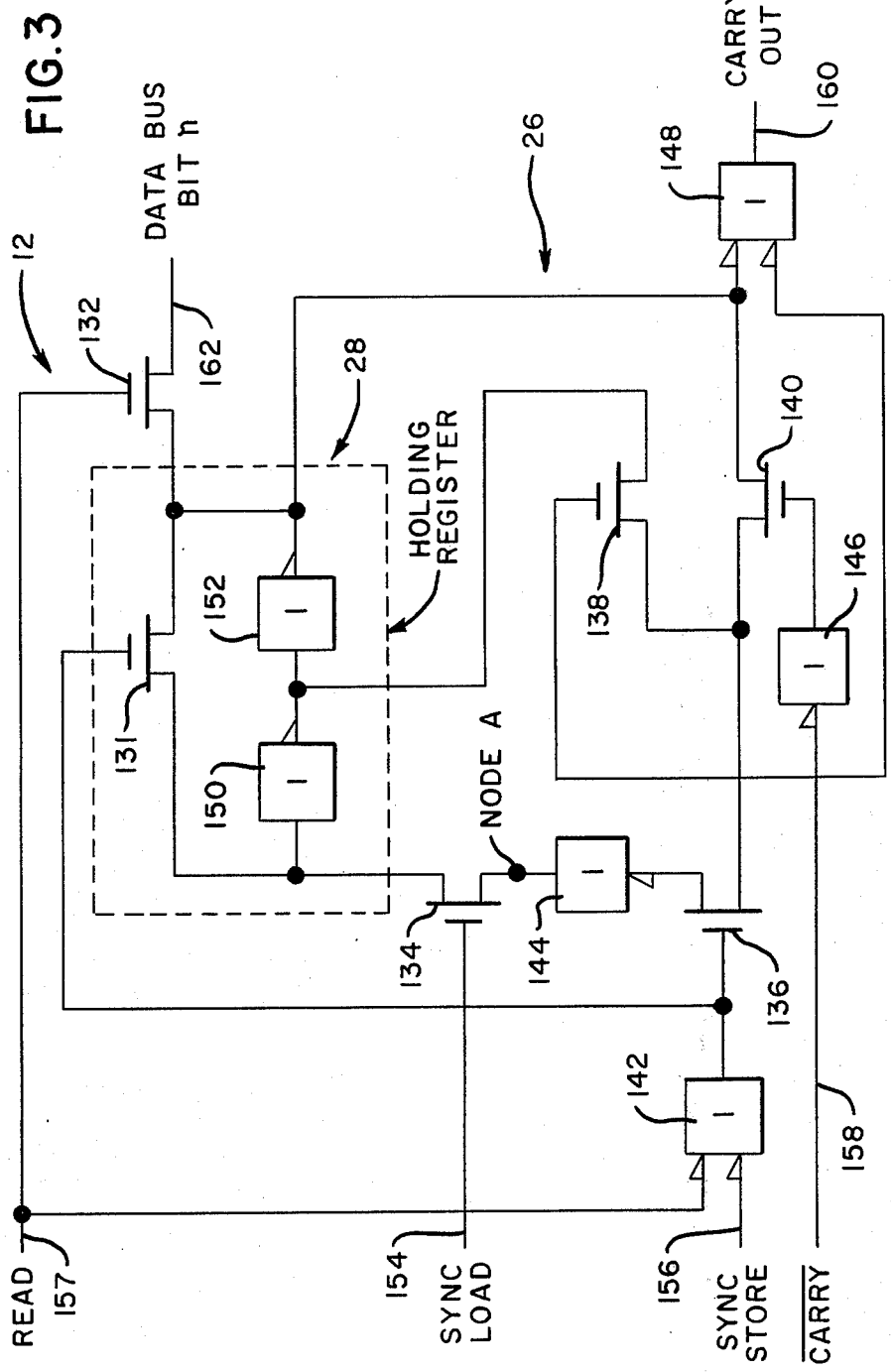
FIG. 3 is a detailed schematic diagram of a single bit of a timer/counter circuit that is suitable for use in combination with the synchronizer circuit of the present invention.

A single bit of the timer/counter circuit 12 is schematically illustrated in FIG. 3. As shown in FIG. 3, the timer/counter circuit 12 is basically comprised of a plurality of field effect transistors which are designated by the numerals 131, 132, 134, 136, 138 and 140, and a plurality of associated logic gates which are designated by the numerals 142, 144, 146, 148, 150 and 152. The timer/counter circuit 12 is equipped with a sync load input 154 which is suitably coupled with the sync load line 14 (shown in FIG. 1), a sync store input 156 which is suitably coupled with the sync store line 16 (shown in FIG. 1), and a read input 157 which is suitably coupled with the read input line 45 (shown in FIG. 1). In addition, the timer/counter circuit 12 is provided with a carry input 158, a carry out output 160, and a data bit output 162.

In an N-bit counter there are N of these circuits, suitably interconnected. In particular, the carry input 158 of this circuit is electrically coupled with the carry out output of the preceding bit of the timer/counter circuit, while the carry out output 160 is electrically coupled with the carry input of the following bit of the timer/counter circuit. The carry input of the least significant bit is in turn suitably coupled with the carry input 32 (shown in FIG. 1).

Logic gates 150 and 152 are connected across the source and drain terminals of transistor 131 to form one bit of holding register 28. Inverter 144 and transistors 134, 136, 138 and 140 are arranged to provide a feedback network which is used to update the count state stored in holding register 28 in response to load and store signals applied to the sync load input 154 and the sync store input 156, respectively. In particular, the sync load input 154 is electrically coupled with the gate terminal of transistor 134, while the sync store input is electrically coupled with the gate terminal of transistor 136 through NOR gate 142. The other input of NOR gate 142 is electrically coupled with read input 157, which is also coupled with the gate terminal of transistor 132. The carry input 158, which is used to control the updating direction of this bit of the storage register, is in turn electrically coupled with the gate terminal of transistor 138, with the gate terminal of transistor 140 through an inverter 146, and with one input of NOR gate 148. The other input of NOR gate 148 is electrically coupled with the output of inverter 152, while the output of this logic gate is electrically coupled with the carry out output 160. In operation, termination of the last clock pulse of timing signal B preceding a load pulse initiates the search period associated with a load pulse. The search period is subseqently terminated upon receipt of the load pulse at input 18.

Receipt of a read command at input 34 within the search period preceding a load pulse causes the delay operation of synchronizer circuit 10 to be initiated by placing latch 38 in a set condition. During the period preceding a load pulse when timing signal B is disabled, NOR gate 108 is in condition to provide a set signal to latch 45 upon receipt of a read command at input 34. If a read command is received by the synchronizer circuit 10 during this period, latch 45 is placed in a set condition causing a low level logic signal to be provided at the output of NOR gate 104. This low level logic signal is in turn provided to one input of NOR gate 65. Latch 45 remains in a set condition until a clock pulse of timing signal B is received at input 24. Since another clock pulse of timing signal B is not received at input 24 until after the occurrence of the next load pulse, latch 45 is still in a set condition upon receipt of the next load pulse. Receipt of a load pulse while latch 45 is in a set condition causes logic gate 65 to be enabled, thereby providing a set signal to latch 38. Latch 38 responds to this set signal by assuming a set condition wherein the output of NOR gate 60 is at a high level logic state.

If a read command is received at input 34 after the start of the anticipation pulse of timing signal A and prior to the receipt of the next load pulse, NOR gate 64 is immediately enabled causing a set signal to be provided to latch 38. Latch 45 is also placed in a set condition since the read command was received at input 34 without the coincident receipt of a load pulse at input 18. Thereafter, receipt of the next load pulse causes NOR gate 65 to be enabled, thereby providing a second set signal to latch 38. Since latch 38 is already in a set condition, this second set signal has no effect upon the present condition of the latch. The purpose of this dual arrangement for placing latch 38 in a set condition will be more fully discussed below.

As mentioned above, receipt of a load pulse at input 18 causes the search period associated with the load pulse to be terminated. In particular, receipt of a load pulse at input 18 causes logic gate 108 to be disabled for the duration of the pulse. Disabling of logic gate 108 in turn prevents latch 45 from assuming a set condition upon receipt of a read command at input 34.

Receipt of a load pulse at input 18 also causes latch 36 to assume a set condition for the duration of the pulse unless a read command is being received at input 34. Receipt of a read command at input 34 causes AND gates 50 and 54 to be disabled and to remain disabled as long as the read command continues to be received. Disabling of these AND gates in turn isolates the flip flop comprised of NOR gates 46 and 48 from the load input 18, thereby making this flip flop unresponsive to the receipt of a load pulse at input 18. Receipt of a load pulse at input 18 while a read command is not being received at input 34, however, causes AND gate 50 to be enabled, thereby providing a set signal to the flip flop comprised of NOR gates 46 and 48. This flip flop responds to a set signal by assuming a set condition wherein a high level logic signal is provided at the output of NOR gate 46. Termination of the load pulse, on the other hand, causes AND gate 50 to be disabled and AND gate 54 to be enabled. Upon becoming enabled, AND gate 54 applies a reset signal to the flip flop comprised of NOR gates 46 and 48, thereby causing latch 36 to return a set condition. Resetting of latch 36 in turn causes the output of NOR gate 46 to return to a low level logic state. In this way, latch 36 is capable of providing at the output of NOR gate 46 a logic signal that corresponds to the logic state of the signal received at input 18 as long as a read command is not being received at input 34.

The output of NOR gate 46 is in turn inverted by inverter 60 before being provided to one input of NOR gate 58. The other input of NOR gate 58 is coupled with the output of latch 45 and is at a low level logic state if a read command was not received at input 34 within the search period preceding the load pulse. NOR gate 58 is arranged to provide a high level logic signal at its output whenever both of its inputs are at a low level logic state. If a read command was received at input 18 within the search period preceding the load pulse, latch 45 is in a set condition, thereby causing a high level logic signal to be applied to one input of NOR gate 58. This high level logic signal in turn causes NOR gate 58 to be disabled and to remain disabled until latch 45 is returned to a reset condition. As a result, the output of NOR gate 58 is at a high level logic state while a load pulse is being received at input 18 as long as a read command is not simultaneously being received at input 34 and as long as a read command was not received at input 34 within the search period preceding the load pulse.

The output of NOR gate 58 is in turn electrically coupled with one input of NOR gate 60 to act as a reset for latch 38. As a result, the production of a high level logic signal at the output of NOR gate 58 in response to the receipt of a load pulse at input 18 without the prior receipt of a read command at input 34 causes a reset signal to be applied to latch 38. As shown in FIG. 4, each anticipation pulse is terminated prior to termination of its accompanying load pulse. Accordingly, NOR gate 64 returns to a disabled condition while a reset signal is still being applied to latch 38. Upon becoming disabled, NOR gate 64 is no longer able to provide a set signal to latch 38 upon receipt of a read command at input 34. Since NOR gates 64 and 108 are disabled while the load pulse is still being received, latch 38 is precluded from obtaining a set condition upon receipt of such a pulse. Accordingly, receipt of a load pulse serves to terminate the search period associated with the load pulse. In this way, latch elements 38 and 45 cooperate to search for the receipt of a read command at input 34 within the search period that precedes each load pulse. This search period is initiated by the synchronizer circuit upon termination of the last clock pulse of timing signal B preceding a load pulse and continues until the start of the load pulse.

While the anticipation pulse of timing signal A and NOR gate 64 may appear to be superfluous, they are provided to ensure against loss of a load pulse if a read command is received at input 34 just prior to or coincident with the receipt of a load pulse at input 18. If a read command is received by the synchronizer circuit 10 just prior to or coincident with the receipt of a load pulse, it is possible that neither latch 45 nor latch 36 will assume a set condition due to various time delays inherent in the components of the synchronizer circuit. The occurrence of this condition would cause a load pulse to be lost, thereby adversely effecting the count state of the timer/counter circuit. Inclusion of NOR gate 64 and generation of timing signal A remedies this defect by providing a set signal directly to latch 38 upon receipt of a read command while an anticipation pulse is being received at input 22. In this way, latch 38 is placed in a set condition whenever a read command is received by the synchronizer circuit while an anticipation pulse is received at input 22 and is reset only if a received load pulse is properly reproduced at the output of NOR gate 58. This arrangement makes the design and fabrication of the synchronizer circuit 10 less critical.

In summary, the synchronizer circuit is operable to initiate a search period upon termination of the last clock pulse of timing signal B preceding a load pulse. The search period is subsequently terminated upon receipt of the next load pulse at input 18. If a read command is received at input 34 within the search period preceding a load pulse, latch 45 is placed in a set condition thereby conditioning logic gate 65 to be enabled upon receipt of the load pulse associated with the search period. Receipt of this load pulse enables logic gate 65 causing a set signal to be applied to latch 38. Additionally, receipt of a read command coincident with the receipt of an anticipation pulse at input 22 causes NOR gate 64 to be enabled thereby providing a set signal to latch 38 directly. The receipt of the search period's accompanying load pulse at input 18 prior to receipt of a read command at input 34, however, causes a reset signal to be applied to latch 38 from the output of NOR gate 58. This reset signal causes latch 38 to remain in a reset condition even if a read command is subsequently received at input 34. Since the anticipation pulse provided to input 22 is terminated prior to termination of this reset signal and since NOR gate 108 is disabled upon receipt of the load pulse which generated the reset signal, receipt of the search period's accompanying load pulse terminates the search period. In this way, latch 38 is capable of assuming a set condition only if a read command is received at input 34 during a limited time period, which is referred to as the search period.

The remaining description of the operation of the synchronizer circuit 10 is divided into two sections. The first section describes the operation of synchronizer circuit 10 when a read command is not received by the synchronizer circuit within the search period preceding a load pulse. The second section of the description covers operation of synchronizer circuit 10 when a read command is received by the synchronizer circuit within the search period preceding a load pulse.

Since it is assumed for the purposes of this section of the description that a read command is not received at input 34 within the search period preceding a load pulse, receipt of the load pulse causes latch 36 to bet set and a high level logic signal to be produced at the output of NOR gate 58 while this pulse is being received. This high level logic signal is in turn simultaneously provided to NOR gate 60, NOR gate 100, and NOR gate 126. NOR gate 60 responds to this high level logic signal by forcing latch 38 to remain in a reset condition, thereby terminating the search period.

The presence of a high level logic signal at the output of logic gate 58 also causes logic gate 126 to be disabled, thereby causing its output to obtain a low level logic state. The low level logic signal produced at the output of logic gate 126 is in turn applied to one input of NOR gate 128. The other input of NOR gate 128 is electrically coupled with latch 45 and is at a low level logic state since a read command was not received by the synchronizer circuit within the preceding search period. As a result, NOR gate 128 responds to the transition of the output of NOR gate 126 from a high level logic state to a low level logic state by becoming enabled, thereby providing at output 33 a high level logic signal. Output 33 is in turn electrically coupled with the sync load line 14 such that this high level logic signal is capable of being transferred to timer/counter circuit 12.

Upon termination of the load pulse, latch 36 returns to a reset condition, thereby causing the output of this latch to assume a low level logic state. This transition causes NOR gate 58 to be disabled, thereby removing the reset signal from latch 38. Disabling of NOR gate 58 also causes NOR gate 126 to return to its enabled condition. Enabling of NOR gate 126 in turn causes NOR gate 128 to be disabled, thereby causing the output of NOR gate 128 to return to a low level logic state. In this way, synchronizer circuit 10 is capable of producing at output 33 an output pulse within a set time period after the receipt of a load pulse at input 18 if a read command was not received at input 34 within the search period preceding this load pulse. The time period between receipt of a load pulse at input 18 and production of an output pulse at output 33 is determined by the internal delays of the circuit's various components. As a result, the synchronizer circuit is capable of passing a received load pulse from input 18 to output 33 uninhibited if a read command is not received at input 34 within the search period preceding the load pulse.

The store signal shown in FIG. 4 takes a somewhat different path through synchronizer circuit 10. In particular, the store signal is received by synchronizer circuit 10 at input 20. As shown in FIG. 4, the store signal provided to input 20 changes from a high level logic state to a low level logic state just before the occurrence of a load pulse. Inverter 130 produces at its output a signal having a logic state that is the opposite of the logic state of the signal being received at input 20. The output of inverter 130 is in turn applied to one input of logic gate 118. When the output of logic gate 130 assumes a high level logic state in response to the store signal received at input 20 being at a low level logic state, the output of NOR gate 118 becomes disabled, thereby causing the output of this gate to assume a low level logic state. The logic signal produced at the output of logic gate 118 is in turn applied to output 35, which is coupled with the sync store line 16 (shown in FIG. 1). If a read command was not received at input 34 within the search period preceding the load pulse that is framed by the store signal, then the output of logic gate 118 remains at a low level logic state until the logic state of the store signal returns to a high level logic state. In this way, synchronizer circuit 10 is capable of passing to the sync store line 16 an output signal having a logic state that corresponds to the logic state of the store signal received at input 20.

If a read pulse is received by synchronizer circuit 10 during the search period preceding a load pulse, the operation of the synchronizer circuit is significantly different. A description of the operation of synchronizer circuit 10 following receipt of a read command within the search period preceding a load pulse is to follow. In addition, the operation of the synchronizer circuit when a read command is received at input 18 within the search period preceding a load pulse is graphically illustrated in FIG. 6.

The receipt of a read command at input 34 within the search period preceding a load pulse causes several things to occur. First, latch 38 is placed in a set condition as discussed above. Placement of latch 38 in a set condition causes a high level logic signal to be provided at the output of NOR gate 60. Production of this high level logic signal in turn causes latch 40 to assume a set condition. As shown in FIG. 6, timing signal B is at a low level logic state (disabled) during each search period. When timing signal B is at a low level logic state, a high level logic signal is simultaneously applied to one input of AND gates 78 and 80 through inverter 82. Upon generation of a high level logic signal at the output of NOR gate 60, AND gate 78 becomes disabled and AND gate 80 is enabled. Enabling of AND gate 80 in turn causes the flip flop comprised of NOR gates 74 and 76 to assume a set condition wherein a high level logic signal is provided at the output of NOR gate 74.

In addition to causing latch 38 to assume a set condition, the receipt of a read pulse within the search period preceding a load pulse inhibits the above-described propagation of the load pulse from input 18 to output 34. In particular, receipt of a read command at input 34 causes AND gates 50 and 54 to be disabled, thereby making latch 36 unresponsive to the receipt of a load pulse at input 18 while a read command is being received by the synchronizer circuit. As a result, latch 36 will not provide at the output of NOR gate 46 a high level logic signal upon receipt of a load pulse if a read command is being simultaneously received at input 34. In addition, the receipt of a read command at input 34 while a load pulse is not being received at input 18 causes AND gate 108 to be enabled. Enabling of AND gate 108 in turn causes a set signal to be provided to latch 45. Latch 45 responds to a set signal by assuming a set condition wherein a low level logic signal is produced at the output of NOR gate 104. This low level logic signal is inverted by inverter 112 before being applied to one input of NOR gate 58 and to one input of NOR gate 128. The application of a high level logic signal to NOR gate 58 and to NOR gate 128 causes both of these gates to be disabled. Disabling of these gates precludes the synchronizer circuit from producing at output 33 an output pulse in response to the receipt of a load pulse at input 18. As a result, the receipt of a read command at input 34 prior to receipt of a load pulse at input 18 inhibits propagation of this load pulse even if the read command is not being received at input 34 coincident with the receipt of this load pulse. In this way, the synchronizer circuit is capable of inhibiting the normal propagation of a load pulse if a read command is received at input 34 within the search period preceding this load pulse.

As shown in FIG. 6, a plurality of clock pulses are periodically applied to the timing signal B input a set time period after termination of a load pulse. The receipt of the first such clock pulse at input 24 in turn causes latch 45 to return to a reset condition wherein the output of NOR gate 104 is at a high level logic state. This high level logic signal is in turn provided to one input of NOR gates 58 and 128, thereby placing these logic gates in condition to produce a high level logic signal at their outputs upon receipt of a low level logic signal at the other input of either of these two logic gates.

The receipt of this first clock pulse at input 24 also causes latch 42 to be placed in a set condition, thereby producing a high level logic signal at the output of NOR gate 88. In particular, receipt of this clock signal enables AND gate 90, thereby allowing the high level logic signal produced at the output of NOR gate 74 to be passed to the set input of the flip flop comprised of NOR gates 86 and 88. Setting of this flip flop causes a high level logic signal to be produced at the output of NOR gate 88. This high level logic signal is then inverted by means of inverter 102 to a low level logic signal which is applied to one input of NOR gate 100.

Latch 38 remains in a set condition until a clock pulse is received at input 22 while a read command is not being received at input 34. When both of these conditions occur, logic gate 70 is enabled, thereby causing a reset signal to be applied to latch 38. In FIG. 5, the read command is shown terminating coincident with the receipt of the first clock pulse of timing signal B. Accordingly, receipt of this clock pulse at input 24 causes latch 38 to be reset as shown in FIG. 6. Resetting of latch 38 causes the output of NOR gate 60 to return to a low level logic state.

Resetting of latch 38 causes a low level logic signal to be applied to one input of AND gate 80 and a high level logic signal to be applied to one input of AND gate 78 through inverter 84. Upon termination of the clock pulse of timing signal B during which latch 38 was reset, AND gate 78 is enabled, thereby providing a reset signal to the flip flop comprised of NOR gates 74 and 76. This flip flop responds to this reset signal by assuming a reset condition wherein the output of NOR gate 74 is at a low level logic state and the output of NOR gate 76 is at a high level logic state. In this way, latch 40 returns to a reset condition upon termination of the clock pulse during which latch 38 was reset. By causing latch 40 to be reset upon termination of the clock pulse during which latch 38 was reset, latch 40 cooperates with latch 38 to establish a time delay which is initiated upon receipt of a read command and terminated shortly after termination of this read command.

As the output of NOR gate 74 assumes a low level logic state in response to latch 40 being reset, NOR gate 100 is enabled, thereby providing a set signal to latch 44. Latch 44 responds to this set signal by assuming a set condition wherein the output of NOR gate 96 is at a low level logic state. The low level logic signal produced at the output of NOR gate 96 is applied to one input of NOR gate 124 where it is used to condition this gate to be enabled upon receipt of the next clock pulse of timing signal B, which is hereinafter referred to as the "output generating pulse." In the example shown in FIG. 6, the output generating pulse corresponds to the second clock pulse of timing signal B since latch 38 was reset during the first clock pulse of timing signal B. The transition of latch 40 from a set to a reset condition also places AND gate 92 in condition to provide a reset signal to the flip flop comprised of NOR gates 86 and 88 upon receipt of the output generating pulse of timing signal B at input 24.

Upon receipt of the output generating pulse, latch 42 is immediately reset and NOR gate 124 is enabled for the duration of the pulse. The NOR gate 124 is capable of providing a high level logic signal at its output while it is in an enabled condition. This high level logic signal causes NOR gate 126 to be disabled, which in turn causes NOR gate 128 to be enabled. Enabling of NOR gate 128 in turn produces a high level logic signal at output 33. This high level logic signal is generated on output 33 coincident with the receipt of the output generating pulse of timing signal B at input 24 and is referred to as a delayed load pulse. This delayed load pulse is in turn transferred to timer/counter circuit 12 via the sync load line 14 (FIG. 1).

Resetting of latch 42 upon receipt of the output generating pulse causes the output of logic gate 88 to assume a low level logic state. The transition of the output of NOR gate 88 from a high level logic state to a low level logic state causes NOR gate 100 to be disabled, thereby terminating the set signal that was applied to latch 44. Termination of this set signal allows latch 44 to be reset upon termination of the output generating pulse of timing signal B. Termination of this clock pulse causes a high level logic signal to be applied to the reset input of latch 44 through inverter 82. Upon receipt of this reset signal, latch 44 assumes a reset condition wherein the output of NOR gate 96 is at a high level logic state. This high level logic signal serves to maintain NOR gate 124 in a disabled condition, thereby making it unresponsive to any further clock pulses that may be received at input 24.

In summary, receipt of a read command at input 34 within the search period preceding a load pulse causes the load pulse to be inhibited and latch 38 to be set, which in turn causes latch 40 to be set. Upon receipt of the first clock pulse of timing signal B, latch 42 is placed in a set condition. Latch 38 remains in a set condition until a clock pulse of timing signal B is received at input 24 while a read command is not being received at input 34. Resetting of latch 38 in turn allows latch 40 to be reset upon termination of the clock pulse during which latch 38 was reset. Thereafter, NOR gate 100 responds to latch 40 being in a reset condition while latch 42 is in a set condition by causing a set signal to be applied to latch 44. Latch 44 responds to this set signal by assuming a set condition wherein a low level logic signal is applied to one input of NOR gate 124, thereby placing this NOR gate in condition to be enabled upon receipt of the next clock pulse. Resetting of latch 40 also places latch 42 in condition to be reset upon receipt of the next clock pulse of timing signal B. Upon receipt of the next clock pulse latch 42 is reset and a delayed load pulse is provided at output 33. Upon termination of this clock pulse, latch 44 is reset and the delayed load pulse is terminated. Thereafter, synchronizer circuit 10 is in condition to initiate a new search period in response to a new anticipation pulse.

If a read command is received at input 34 within the search period preceding a load pulse, synchronizer circuit 10 is also capable of maintaining output 35 at a low level logic state until after a delayed load pulse is produced at output 33. In particular, latches 38, 40 and 42 are capable of providing a high level logic signal to NOR gate 114 whenever any of them is in a set condition. NOR gate 114 responds to the receipt of a high level logic signal from any one or combination of these latches by becoming disabled, thereby producing a low level logic signal at its output. This low level logic signal is in turn inverted by inverter 116 before being provided to one input of NOR gate 118. NOR gate 118 responds to the receipt of a high level logic signal at any one of its inputs by becoming disabled. Disabling of NOR gate 118 in turn causes a low level logic signal to be provided at output 35, which is electrically coupled with the sync store line 16 (FIG. 1).

As shown in FIG. 6, at least one of the above-mentioned latches (38, 40 or 42) is in a set condition until production of a delayed load pulse at output 33. As a result, these latches serve to keep AND gate 118 disabled until a delayed load pulse is produced at output 33. The delayed load pulse produced at output 33 is also provided to one input of AND gate 118 as a high level logic signal that is capable of maintaining AND gate 118 in a disabled condition. Upon termination of the delayed load pulse, all of the above-mentioned latches have already returned to a reset condition, thereby causing NOR gate 114 to be enabled, which in turn causes a low level logic signal to be applied to AND gate 118 from NOR gate 114. Termination of the load pulse causes the third input of AND gate 118 to assume a low level logic state, which in turn allows AND gate 118 to be enabled. Upon being enabled, AND gate 35 provides a high level logic signal to output 35.

Reference is now made to FIG. 3 for a brief description of the operation of timer/counter circuit 12. Receipt of a low level logic signal at input 156 while a read command is not being received at input 157 causes either the logic signal at the output of inverter 150 or the logic signal at the output of inverter 152 to be temporarily stored at the node between inverter 144 and transistor 134. Selection of the output to be stored at the node between inverter 144 and transistor 134 is determined by the logic state of the signal received at input 158. Thereafter, receipt of a load pulse at input 154 causes the count state stored within storage register 28 to be updated in accordance with the signal stored at the node between inverter 144 and transistor 134. The receipt of a read command at input 157, however, causes AND gate 142 to be disabled and the present value stored within storage register 28 to be provided to data output 159.

From the foregoing, it can be seen that this invention is one well adapted to attain all the ends and objects herein set forth, together with other advantages that are obvious and that are inherent in the structure.

It will be understood that certain features and subcombinations are of utility and may be employed without reference to other features and subcombinations.

As many possible embodiments may be made of the invention without departing from the scope thereof, it must be understood that all matter herein set forth or shown in the accompanying drawings is to be interpreted as illustrative and not in a limiting sense.

I claim:

1. A synchronizer circuit for controlling the counting operation of an associated timer/counter circuit which is suitable for use in a microcomputer system to perform various timing and counting functions, said synchronizer circuit comprising:
   a load input for receiving load pulses from an external source;
   a load output;
   a read input for receiving read commands from an external source;
   a clock input for receiving a clock signal from an external source, said clock signal being arranged to periodically oscillate between a first logic state and a second logic state and to be disabled for a set period of time prior to and after a load pulse; and
   search means for monitoring said read input for receipt of a read command, said search means being operable to produce an output pulse at said load output within a first time interval after receipt of a load pulse if a read command was not received at said read input during the period preceding said load pulse when said clock signal was disabled and to produce an output pulse at said load output within a second time interval after receipt of a load pulse if a read command was received at said read input during the period preceding said load pulse when said clock signal was disabled.

2. A synchronizer circuit as in claim 1 including:
   a store input for receiving a store signal from an external source, said store signal having a first and a second logic state;
   a store output; and
   means for producing at said store output a store output signal having a logic state corresponding to the logic state of the store signal being received at said store input.

3. A synchronizer circuit as in claim 1 including means for maintaining said store output signal at a set logic state until after production of an output pulse at said load output if a read command is received at said read input during a search period.

4. A synchronizer circuit as in claim 1 wherein said search means is comprised of
   monitoring means for producing a delay signal if a read command is received at said read input during the period preceding a load pulse when said clock signal is disabled;
   first means for producing at said load output an output pulse within a set time period after receipt of a load pulse if said load pulse is received at said load input while a delay signal is not being produced by said monitoring means;
   second means for producing at said load output an output pulse within a second time period after receipt of a load pulse if said load pulse is received at said load input while a delay signal is being produced by said monitoring means; and
   means for terminating production of said delay signal by said monitoring means whenever said clock signal is in said second logic state while a read command is not being received at said read intput.

5. A synchronizer circuit as in claim 4 wherein said monitoring means is comprised of
   latch means for producing said delay signal whenever said latch means is in a set condition, said latch means being operable to assume and remain in said set condition whenever a read command is received at said read input while the timing signal received at said timing input is in said first logic state and to assume and remain in a reset condition upon receipt of a reset signal.

6. A synchronizer circuit as in claim 5 wherein said means for terminating production of said delay signal is comprised of gate means for providing a reset signal to said latch means whenever said clock signal is in said first logic state while a read command is not being received at said read input.

7. A synchronizer circuit as in claim 4 wherein said first means is comprised of
   a first latch means for producing an output signal having a logic state corresponding to the logic state of the signal being received at said load input,
   means for disabling said first latch means whenever a read command is being received at said read input, and
   gate means for coupling said first latch means with said load output, said gate means being arranged to be disabled in response to said delay signal.

8. A synchronizer circuit as in claim 4 wherein said second means is comprised of
   delay means for establishing a time delay in response to said delay signal, and
   pulse generating means for producing at said load output a delayed load pulse following completion of said time delay.

* * * * *